United States Patent [19]
Granneman

[11] Patent Number: 5,327,005
[45] Date of Patent: Jul. 5, 1994

[54] STRIPED CONTACT IR DETECTOR

[75] Inventor: Russell D. Granneman, Goleta, Calif.

[73] Assignee: Santa Barbara Research Center, Goleta, Calif.

[21] Appl. No.: 809,819

[22] Filed: Dec. 18, 1991

[51] Int. Cl.$^5$ .................. H01L 27/14; H01L 31/00
[52] U.S. Cl. ...................... 257/443; 257/447; 257/448; 257/459; 257/465
[58] Field of Search ............. 257/465, 447, 448, 459, 257/443, 461, 466; 250/338.4

[56] References Cited

U.S. PATENT DOCUMENTS

| | | | |
|---|---|---|---|
| 4,282,290 | 8/1981 | Pellicori | 428/472 |
| 4,377,817 | 3/1983 | Nishizawa et al. | 257/447 |
| 4,578,693 | 3/1986 | Yazawa et al. | 257/448 |
| 4,717,946 | 1/1988 | Godfrey | 257/448 |
| 5,122,669 | 6/1992 | Herring | 250/370.14 |
| 5,132,747 | 7/1992 | Matsushima et al. | 257/465 |

FOREIGN PATENT DOCUMENTS

WO83/04456 12/1983 European Pat. Off.

*Primary Examiner*—Sara W. Crane
*Attorney, Agent, or Firm*—W. C. Schubert; W. K. Denson-Low

[57] ABSTRACT

An IR detector array (10) wherein a metal contact pad (20) makes contact to an underlying radiation detector through one or more thin, electrically conductive stripes (20a). The striped pad contact shape is used in conjunction with a highly absorptive and opaque coating (18) that is interposed between a bottom surface of the contact pad and a top surface of the radiation detector. The highly absorptive coating serves to mask the bottom surface of the metal contact pad from any radiation that would impinge thereon and be reflected. As a result, stray or unabsorbed radiation reaching to a region of the contact pad encounters only the relatively small target presented by the edge of the one or more thin electrically conductive stripes. Furthermore, the one or more thin stripes are aligned with respect to a radiation scan axis and/or rotation axis so as to further minimize the width of the contact edge presented to the unabsorbed radiation, thereby further reducing the probability of an unwanted reflection occurring.

13 Claims, 3 Drawing Sheets

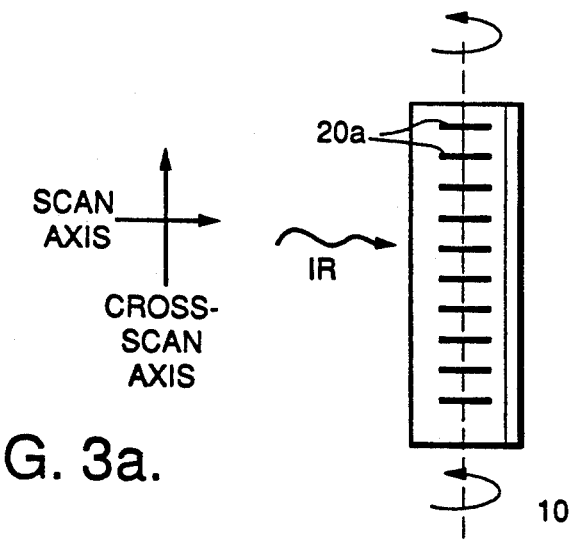
FIG. 3a.
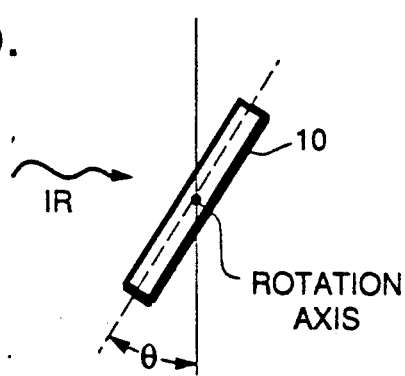
FIG. 3b.
FIG. 4.
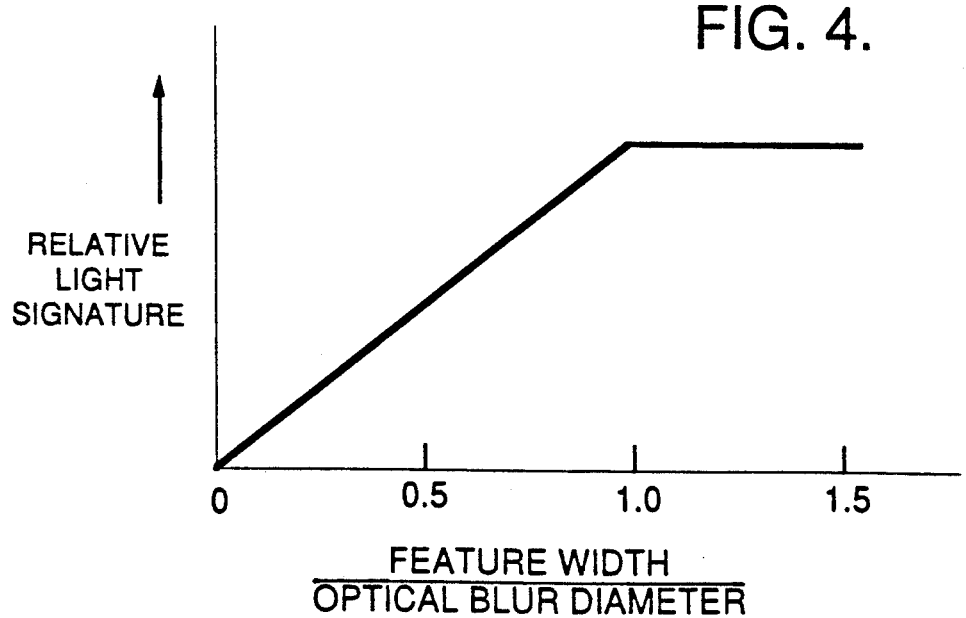

STRIPED CONTACT IR DETECTOR

CROSS-REFERENCE TO RELATED PATENT APPLICATION

This patent application is related to commonly assigned U.S. patent application Ser. No. 811,599, filed on even date herewith, and entitled "Infrared Detector with Reduced Optical Signature", by P. Norton.

FIELD OF THE INVENTION

This invention relates generally to radiation detectors, and relates particularly to back-side illuminated detectors of infrared (IR) radiation.

BACKGROUND OF THE INVENTION

IR radiation detectors provide an electrical output which is a measure of incident IR radiation. One particularly useful IR detector is a photovoltaic (PV) detector fabricated from Group II-VI radiation absorbing semiconductor material, such as mercury-cadmium-telluride (HgCdTe). HgCdTe detectors are typically fabricated as linear and two-dimensional arrays. Generally, a transparent substrate supports a radiation absorbing semiconductor layer having a first electrical conductivity, and a second semiconductor layer of opposite electrical conductivity forms a p-n junction with the first layer. The array may be differentiated into a plurality of p-n junctions by selectively etching the semiconductor material, resulting in the formation of a plurality of upstanding "mesa" structures, each of which contains a radiation detecting element, or pixel. The array typically includes a layer of passivation applied to an outer surface so as to reduce surface states and resulting noise signals that detrimentally affect the operation of the p-n junction. An anti-reflection (AR) coating may also be applied over the passivation layer to reduce reflections of incident radiation. Each of the radiation detecting elements includes a contact, normally provided in the form of one or more square or round metal pads. The contact pad(s) provides electrical contact for external read-out circuitry, typically via an indium "bump" interconnect, to the p-n junction. If radiation enters the array through the bottom surface of the substrate, that is, the surface opposite to the surface that supports the radiation absorbing semiconductor layer, the array is referred to as a "backside-illuminated" array.

It is conventional practice to scan incident radiation over the array, particularly linear arrays, with a rotating mirror or the like. The direction of the scanned radiation is referred to as a scan axis, and a cross-scan axis is defined to be an axis perpendicular to the scan axis. It is also conventional practice to tilt or rotate the detector array about an axis such that a radiation receiving surface of the array is inclined at an angle to incident radiation. This rotation of the array may be accomplished for both scanned and unscanned, or "staring", detector arrays A problem that is presented during the use of such detector arrays results from reflection of radiation from the edges of the contact pads, mesa sidewall surfaces, and the like. This reflected radiation is radiation that first passes unabsorbed through the substrate, the radiation absorbing semiconductor layer, and the overlying layer of opposite conductivity. This unabsorbed radiation eventually encounters the array "top-side" edges and features and is reflected therefrom back through the body of the array. If the reflected radiation is not absorbed during the second pass through the array, the radiation emerges from the bottom surface of the substrate and may propagate back into space. This propagating radiation signal is often referred to as a "light signature".

It has been determined that one significant contributor to the light signature is the reflection from the contact pad surfaces and edges. This is due to the less than optimum shape and size, so far as minimizing reflections, that are presented by the round or square pad geometries of conventional radiation detectors.

A disadvantage of reducing the size of contact pad structures is that less than an optimal amount of area of the contact pad may contact the underlying detector. This results in poor contact resistance characteristics. This problem becomes especially apparent if it is desired to reduce the area of the square or round contact pads so as to reduce the reflected light signature. That is, as the contact pad area is reduced the contact resistance is generally increased.

What is thus an object of the invention to provide is a radiation detector having a contact pad geometry that, in combination with an adjacent radiation absorptive layer, minimizes the contact pad contribution to the light signature, while also reducing contact pad resistance.

SUMMARY OF THE INVENTION

The foregoing problems are overcome and other advantages are realized by a photovoltaic infrared detector wherein a metal contact pad makes contact to an underlying radiation detector through one or more thin, electrically conductive stripes. The unique three dimensional structure of the pad is used in conjunction with a highly absorptive coating that is interposed between a bottom surface of the contact pad and a top surface of the radiation detector. The highly absorptive coating serves to mask the bottom surface of the metal contact pad from any radiation that would impinge thereon and be reflected. As a result, stray or unabsorbed radiation reaching to the region of the contact pad encounters either the absorptive coating layer or the relatively small target presented by the edge of the one or more thin electrically conductive stripes. Furthermore, the one or more thin stripes are preferentially aligned such that a long axis of each is disposed approximately perpendicular to a rotation axis of the array, thereby further reducing the probability of an unwanted reflection occurring. For a scanned array this results in the long axis of each stripe contact being approximately parallel to the scan axis.

BRIEF DESCRIPTION OF THE DRAWINGS

These and other aspects of the invention are made more apparent in the following Detailed Description of the Invention when read in conjunction with the accompanying Drawing wherein;

FIG. 1b is a cross-sectional view, taken along the section line b—b of FIG. 1a;

FIG. 1c is a cross-sectional view, taken along the section line c—c of FIG. 1a;

FIGS. 3a and 3b are a simplified plan view and a side view, respectively, showing the linear array tilted at an angle θ relative to a plane that is normal to the incident radiation, these Figures also illustrating the relationship of a scan axis, a cross-scan axis, and a rotational axis; and FIG. 4 is a graph showing a relationship of the relative light signature to a feature width/optical blur diameter.

DETAILED DESCRIPTION OF THE INVENTION

Figure 1A:
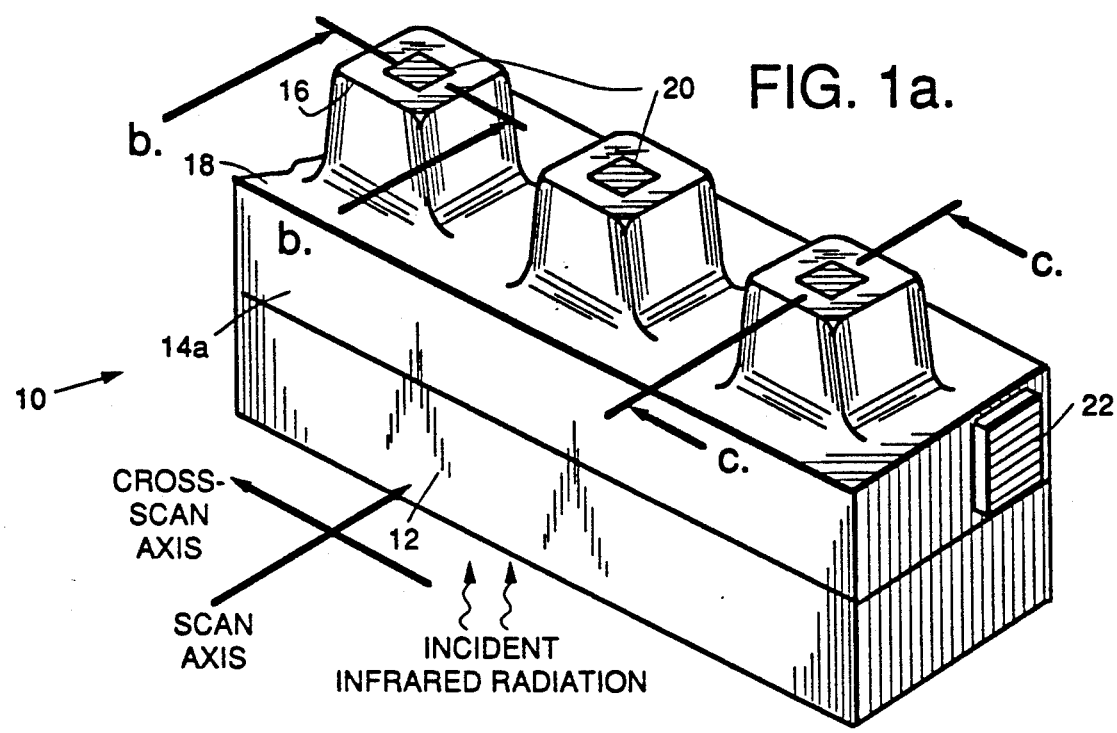
FIG. 1a is an elevational view, not to scale, of a portion of a linear back-side illuminated radiation detector array.
Figure 1B:
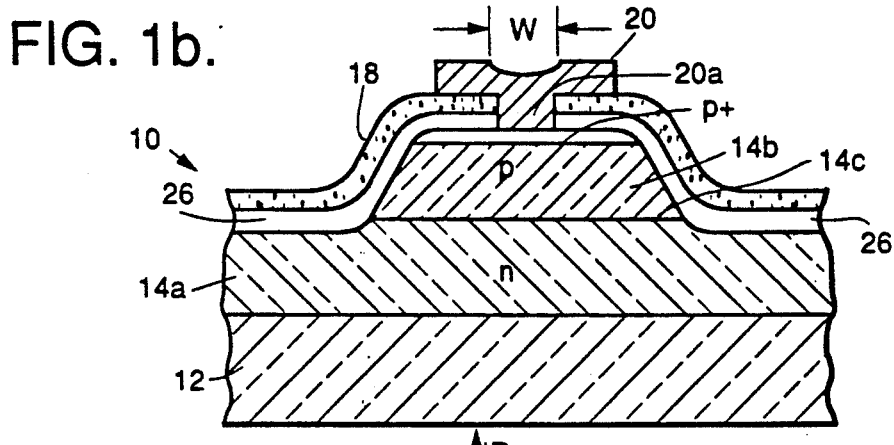
Figure 1C:
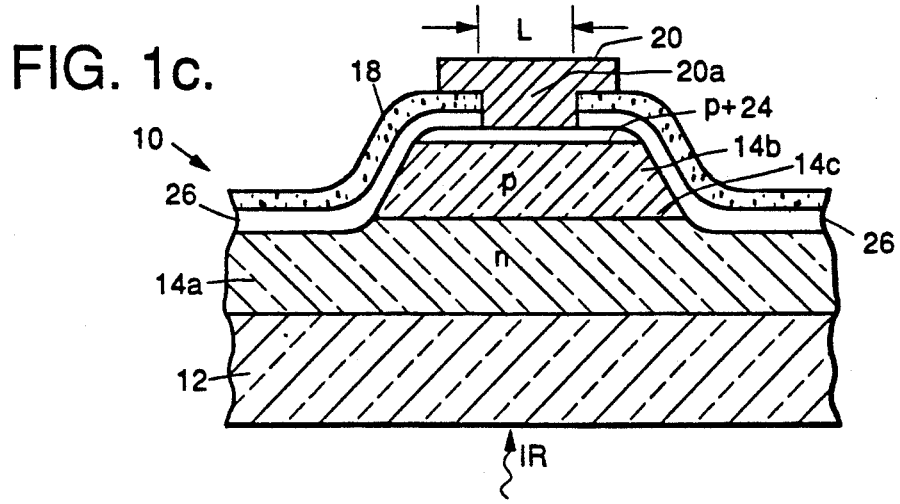

FIG. 1a is an elevational view, not to scale, of a portion of a back-side illuminated radiation detector linear array 10. FIG. 1b is a cross-sectional view of the array 10, taken along the section line b—b of FIG. 1a, and FIG. 1c is a cross-sectional view of the array 10, taken along the section line c—c of FIG. 1a. For the illustrated embodiment, the array is comprised of Group II-VI material and is responsive to IR radiation.

IR radiation is incident upon and passes through a transparent and electrically insulating substrate 12. The IR radiation passes into and is absorbed within an n-type radiation absorbing layer 14a, wherein the absorbed radiation generates electron-hole pairs. The radiation absorbing layer 14a is differentiated into a plurality of mesa structures 16, individual ones of which each contain a p-type layer 14b that overlies the n-type layer 14a and forms a p-n junction 14c therewith. Under the influence of a bias voltage, applied between each contact pad 20 and a common contact 22, minority carriers diffuse toward the p-n junctions 14c and are collected.

A highly conductive p+ layer 24 is optionally employed to reduce the contact resistance between the contact 20 and the p-type layer 14b. Formed over the p+ layer-24, and also the mesa sidewalls, including the edges of the p-n junction 14c, is a passivation layer 26. An optional anti-reflection coating (not shown) may also be deposited over the passivation layer 26, and also over the radiation receiving surface of the substrate 12.

In accordance with an aspect of the invention an opaque and radiation absorptive layer or coating 18 is deposited over the passivation layer 26. The significance of the absorptive coating 18 is described in detail below.

During fabrication, and prior to the formation of the metal contact pad 20, at least one linear trench-like opening 20b is made through the absorptive coating 18 and the underlying passivation layer 26 of each mesa 16. This linear trench-like shape of the opening 20b differs significantly from the conventional round or square opening shape that is typically made. Chemical etching or ion milling, performed through apertures within an appropriately patterned masking layer, are two suitable methods of forming the opening 20b.

During a subsequent metallization process a metal film, such as Au, Pt, or Al, is selectively deposited by, for example, sputtering, thermal evaporation, or electron beam deposition, over the absorptive coating 18 and into the previously formed trench 20b. The resulting contact 20 has a round or, as is also seen in FIGS. 2a and 2b, a square upper contact portion and at least one linear stripe contact 20a that extends therefrom downwardly through the underlying layers 18 and 26 to electrically contact the p+ layer 24.

In FIGS. 1b and 1c the contact pad 20 is provided with a single downwardly extending linear stripe contact 20a.

Figure 2A:
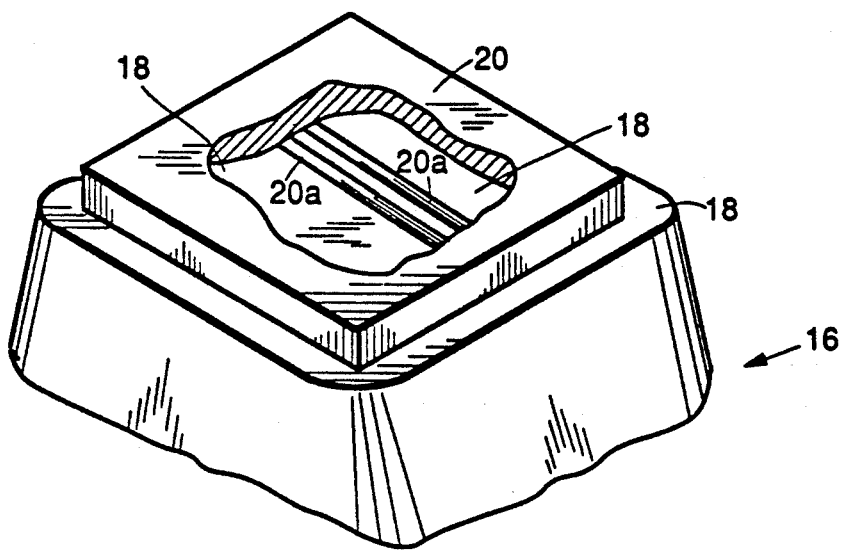
FIG. 2a is an elevational, partially cut-away view of a contact pad of a type having two linear stripe contacts to an underlying radiation detector.
Figure 2B:
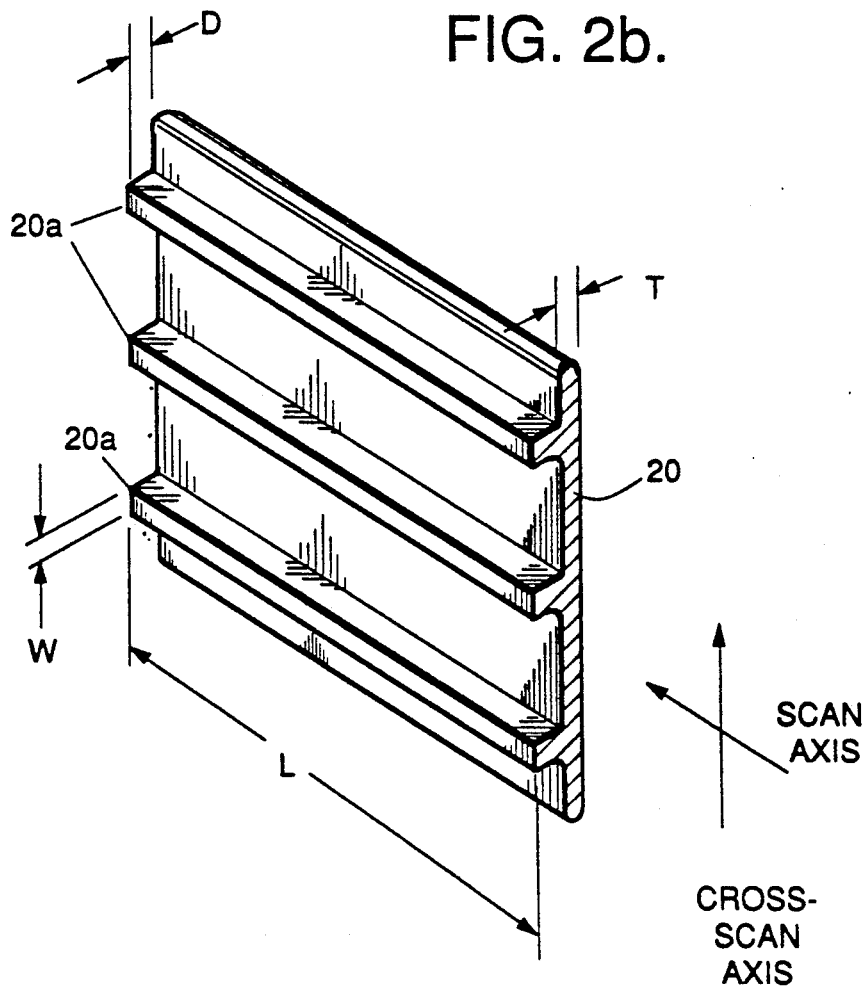
FIG. 2b illustrates a square contact pad having three linear stripe contacts.

FIG. 2a is a partially cut-away view of the square contact pad 20, disposed over the radiation absorptive layer 18, that includes two linear stripe contacts 20a coupled to the underlying radiation detector. FIG. 2b illustrates a square contact pad 20 having three linear stripe contacts 20a. The drawing of FIG. 2b shows the contact pad 20 as it would appear if it were somehow removed from the detector and rotated about one edge.

During use, and as is seen also in FIGS. 3a and 3b, incident radiation is scanned, along the scan axis, across the backside of the detector array 10. The stripe contacts 20a are shown disposed such that a length (L), or long axis, of each striped contact 20a is aligned along the scan axis in a substantially parallel fashion, it being realized that the contacts 20a are actually disposed upon the opposite surface of the array 10. FIG. 3b shows that the array 10 is preferably tilted by an angle θ, relative to a plane normal to the incident radiation, so as to cause any specular reflections to lie outside of an acceptance cone of the surrounding optics system (not shown). One suitable value for θ is 25°, although a number of other angles may be employed depending on the characteristics of the surrounding system and the reflective characteristics of the array 10.

As can be seen, each stripe contact 20a is thus aligned in a perpendicular orientation with the rotation axis of the array 10. For a scanned array the scan axis is thus also aligned in a perpendicular orientation with the rotation axis and, thus, in parallel with the long axis of each stripe contact 20a. It should be realized that the array 10 may be a staring array comprised of a linear or a two-dimensional array of detectors. For a staring array each stripe contact 20a is thus aligned in the perpendicular orientation with the rotation axis of the array 10.

It should be realized that the rotation axis may not pass through the array 10 as shown, but may be located external to the array. It should also be realized that the stripe contacts 20a need not be in an exactly perpendicular relationship with the rotation axis to benefit from the teaching of the invention. However, the more that the stripe contacts 20a deviate from a perpendicular relationship with the rotation axis, the greater will be the area of the contact edge that is presented to the incident radiation and, as a result, the greater will be the magnitude of the reflected light signature.

FIG. 4 illustrates a relationship between a feature width, divided by the optical blur diameter, and the relative magnitude of the light signature. The optical blur diameter is given by 1.22 times lambda, divided by the numerical aperture, as described by W. J. Smith, "Modern Optical Engineering" pages 138-140 (McGraw-Hill, Inc., 1966). As the feature width is decreased along the cross-scan axis, the magnitude of the light signature also decreases. This graph clearly shows that the cross-scan width of a feature is proportional to its optical signature. A leveling off of the signature occurs at a feature width/optical blur diameter of unity.

As a result of the relationship shown in FIG. 4, the width of the linear opening 20b that is made through the absorptive coating 18 and the underlying passivation layer 26, along the rotation axis or cross-scan direction (elevation axis), is preferably made as small as a selected fabrication process will permit. Perpendicular to the rotation axis, and along the scan axis direction (azmuthal axis), the opening 20b is preferably made as long as possible so as to increase the total area of electrical contact with the photodiode. In all cases, the aspect ratio of the linear stripe contact 20a exceeds unity, wherein the aspect ratio is defined as the ratio of length (L) to the width (W).

As an example, a square contact pad may have dimensions of four micrometers by four micrometers. This pad thus presents a four-micrometer wide edge along the cross-scan axis and has a total surface contact area of 16 micrometers$^2$. In accordance with the invention, and for a same sized mesa structure, the upper portion of the contact pad may be increased in size such that the linear stripe contact 20a has dimensions of two micrometers by 20 micrometers. The contact pad 20 of the invention thus presents only a two micrometer wide edge along the cross-scan axis, while having a total surface contact area, with the radiation detector, of 40 micrometers$^2$.

Further in accordance with these representative dimensions, for the two stripe embodiment of FIG. 2a the total width along the cross-scan axis is increased to four micrometers, while the total surface contact area increases to 80 micrometers$^2$. For the three stripe embodiment of FIG. 2b the total cross-scan width is six micrometers, while the total contact surface area is increased to 120 micrometers$^2$.

As can be realized, a trade-off occurs between an acceptable value of the light signature due to contact edge reflections, and contact resistance. As can be further realized, if sufficient contact area is provided, while maintaining an acceptable value for the light signature, the p+ contact layer 24 may be eliminated, thereby reducing array fabrication complexity, yield, and cost.

Although the reduced rotation axis (cross-scan axis) width of the contact 20 described thus far beneficially reduces reflectance from the contact 20, the back surface of the upper portion of the contact 20, which may be made significantly larger than the conventional contact, presents a large reflecting surface for radiation. As such, an important aspect of the invention is the provision of the opaque, radiation absorptive coating 18 that is interposed between the back surface of the contact 20 and the underlying detector device. In that only the relatively narrow linear stripe contact(s) 20a extend down through the coating 18, the back surface area of the contact 20 does not receive or reflect any significant amount of radiation. If desired, an AR coating (not shown) may also be applied over the top surface of the passivation layer 26 to minimize reflections from the passivation layer 26/absorptive coating 18 interface.

Preferably the absorptive coating 18 is opaque to radiation having wavelengths of interest and is also highly absorptive of this radiation. The coating 18 may be embodied in a multi-layered dark mirror coating (DMC) of a type described in, by example, U.S. Pat. No. 4,898,435, issued Feb. 6, 1990, entitled "Dark Mirror Coated Prism". U.S. Pat. No. 4,282,290, issued Aug. 4, 1981, entitled "High Absorption Coating" is another example of a suitable embodiment for coating 18. Reference is also made in this regard to H. A. Macleod, *Thin-Film Optical Filters*, (2nd Ed.), MacMillan Publishing Co., (1986).

In a given embodiment, the relevant spectral region determines whether single layer black coating or a multi-layer dark coating is utilized for the absorptive coating 18. In general, multi-layer dark coatings are designed for a relevant spectral range by varying the materials used for the various layers, the thickness of the layers, and the number of layers.

The dimensions of the contact pad 20 are application dependent. Exemplary dimensions, for a square pad, are 20 micrometers on a side, while a round pad may have a radius of 20 micrometers. The pad 20 has a thickness (T) of several thousand Angstroms. The depth (D) of the linear stripe contact(s) 20a is a function of the underlying opaque absorptive coating 18, the passivation layer 26, and any AR coating applied at the passivation layer 26/absorptive layer 18 interface. By example, a passivation layer 26 comprised of a wide bandwidth semiconductor, such as CdTe, may have a thickness of several thousand Angstroms. The absorptive coating thickness is application and coating material dependent.

Although the detector in FIG. 1 is shown to be a mesa-type, the teaching of the invention also applies to back-side illuminated planar detectors.

Also, although described in the context of a PV Group II-VI scanned array of IR detectors, it should be realized that the teaching of the invention is not limited thereto. For example, the teaching of the invention may be applied also to photoconductive detectors. In general, single devices, linear arrays, and two-dimensional arrays of scanned or unscanned radiation detectors may benefit from the teaching of the invention. The teaching of the invention is also not limited for use only with IR detectors, but may also be employed with back-side illuminated radiation detectors responsive to the visible and other spectrums. The teaching of the invention may also be employed with detectors comprised of other materials, such as Group IV and Group III-V.

Thus, based on the foregoing teaching those having ordinary skill in the art may derive modifications to the embodiments of the invention disclosed above. The invention is therefore not to be construed to be limited only to these disclosed embodiments, but it is instead intended to be limited only as defined by the breadth and scope of the appended claims.

What is claimed is:

1. A backside-illuminated radiation detector comprising:

a radiation responsive region have a first surface for receiving incident radiation and a second, opposite surface;

an electrical contact that is conductively coupled to the second surface of the radiation responsive region, said contact having a substantially planar upper portion having a first surface and an oppositely disposed second surface facing said second surface of said radiation responsive region, said second surface of said contact having at least one substantially linear, stripe-like portion projecting therefrom and oriented at least approximately perpendicular to a rotation axis of the detector for conductively coupling said electrical contact to said radiation responsive region; and a radiation absorptive region interposed between said second surface of said radiation responsive region and said second surface of said contact for absorbing substantially all radiation that would otherwise impinge on and reflect from said second surface of said contact.

2. A radiation detector as set forth in claim 1 wherein said second surface of said contact has a plurality of said substantially linear, stripe-like portions projecting therefrom, each of said stripe-like portions oriented at least approximately perpendicular to a rotation axis of the detector and conductively coupling said electrical contact to said radiation responsive region.

3. A backside-illuminated radiation detector as set forth in claim 1 and further including a passivation layer interposed between said second surface of said radiation responsive region and said radiation absorptive region.

4. A backside-illuminated radiation detector as set forth in claim 3 and further including an anti-reflection coating interposed between said passivation layer and said radiation absorptive region for minimizing a reflection of radiation from an interface between passivation layer and said radiation absorptive region.

5. A backside-illuminated radiation detector as set forth in claim 1 wherein said radiation responsive region includes a first region having a first type of electrical conductivity and a second region having a second type of electrical conductivity for forming a p-n junction with said first region.

6. A backside-illuminated radiation detector as set forth in claim 1 wherein said p-n junction is contained within an upstanding mesa structure, and wherein said electrical contact is located adjacent to a top surface of said mesa structure.

7. An array of back-side illuminated photovoltaic radiation detectors comprising:
   an electrically insulating substrate comprised of a material that is substantially transparent to radiation having wavelengths of interest, the radiation being incident upon a first surface of said substrate;
   a first semiconductor layer overlying a second surface of said substrate and having a first type of electrical conductivity, said first semiconductor layer absorbing radiation received from said substrate and generating charge carriers therefrom, said first semiconductor layer being differentiated into a plurality of active regions;
   a second semiconductor layer overlying said first semiconductor layer within each of said active regions, said second semiconductor layer having a second type of electrical conductivity for forming a p-n junction with each of said active regions;
   a passivation layer overlying said first and said second semiconductor layers;
   an opaque, radiation absorptive layer overlying said passivation layer; and
   for each of said active regions, an electrical contact that is conductively coupled to said second semiconductor layer by portions thereof that pass through one or more openings within an underlying volume of said opaque, radiation absorptive layer and said passivation layer, each of said one or more portions having a width, a length, and a depth, and wherein the width is less than the length and the length is disposed approximately perpendicularly to a rotation axis of the array for reducing reflection of radiation from said contact portions.

8. An array of back-side illuminated photovoltaic radiation detectors as set forth in claim 7 and further including an anti-reflection region interposed between said passivation layer and said opaque, radiation absorptive layer.

9. An array of back-side illuminated photovoltaic radiation detectors as set forth in claim 7 wherein said opaque, radiation absorptive layer is comprised of a plurality of layers selected for absorbing substantially all radiation having the wavelengths of interest.

10. An array of back-side illuminated photovoltaic radiation detectors as set forth in claim 7 wherein said wavelengths of interest include infrared radiation.

11. An array of back-side illuminated photovoltaic radiation detectors as set forth in claim 7 wherein said substrate, said first semiconductor layer, and said second semiconductor layer are each comprised of Group II-VI material.

12. An array of back-side illuminated photovoltaic radiation detectors as set forth in claim 7 and further including, for each of said active regions, a region of enhanced electrical conductivity that is disposed adjacent to said second semiconductor region for conductively coupling said second semiconductor region to said portion or portions of said contact.

13. An array of backsided-illuminated radiation detectors comprising:
   a substrate on which is located a plurality of detectors as set forth in claim 1, wherein said detectors each have said at least one substantially linear, stripe-like portion oriented approximately perpendicular to a common rotation axis of the detectors.

* * * * *